(12) United States Patent
Bryant (10) Patent No.: US 7,863,956 B2
(45) Date of Patent: Jan. 4, 2011

(54) PULSE-ELIMINATION PULSE-WIDTH MODULATION

(75) Inventor: Carl Bryant, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 85 days.

(21) Appl. No.: 12/246,031

(22) Filed: Oct. 6, 2008

(65) Prior Publication Data

US 2010/0085097 A1      Apr. 8, 2010

(51) Int. Cl.
*H03K 3/017*      (2006.01)
(52) U.S. Cl. ........................... 327/175; 327/172
(58) Field of Classification Search ............... None
See application file for complete search history.

(56) References Cited

U.S. PATENT DOCUMENTS

| | | | |
|---|---|---|---|
| 5,657,215 A | 8/1997 | Faulk | |
| 6,130,910 A | 10/2000 | Anderson et al. | |
| 6,538,484 B1 * | 3/2003 | Rappaport et al. | 327/172 |
| 6,970,051 B2 | 11/2005 | Luu et al. | |
| 7,078,963 B1 | 7/2006 | Andersen et al. | |
| 2006/0262843 A1 | 11/2006 | Kim et al. | |

FOREIGN PATENT DOCUMENTS

| | | |
|---|---|---|
| KR | 2002-0034677 A | 5/2002 |
| WO | 2007/020404 A1 | 2/2007 |
| WO | 2008/002225 A1 | 1/2008 |

OTHER PUBLICATIONS

Raab, F., "Radio Frequency Pulsewidth Modulation", IEEE Trans. Comm. pp. 958-966, Aug. 1973.
Viswanathan, V., "Efficiency Enhancement of Base Station Power Amplifiers Using Doherty Technique", M. Sc. Thesis, Virginia Polytechnic Institute and State University, 2004.
Bryant, C., "Pulse-Width Modulation at Radio Frequencies", Master of Science Thesis, University of Twente, Netherlands and Lund University, Sweden, Sep. 24, 2006.
Nielsen, M. et al., "An RF Pulse Width Modulator for Switch-Mode Power Amplification of Varying Envelope Signals", Silicon Monolithic Integrated Circuits in RF Systems, pp. 277-280, Aalborg University, 2007.
International Search Report, EPO, Jan. 12, 2010, Intl Application PCT/EP2009/062832.
Written Opinion, EPO, Jan. 12, 2010, Intl Application PCT/EP2009/062832.

* cited by examiner

*Primary Examiner*—Cassandra Cox
(74) *Attorney, Agent, or Firm*—Potomac Patent Group PLLC (57) ABSTRACT

Instead of reducing the pulse widths of all pulses simultaneously in order to reduce the output power of a switched-mode amplifier linearized by a pulse-width modulator, the width of every other (or every n-th) pulse is reduced. When the widths of the selected pulses have been reduced to zero, the amplifier's output power can be further reduced by selecting further pulses from the remaining non-zero-width pulses, and reducing the widths of those pulses. For example, after every other pulse of an original output signal has been removed, every other pulse of the remaining pulses can be reduced to obtain still lower amplifier output power. In this way, the number of pulses (and thus the number of switching transitions) is reduced for small signals, and therefore the amplifier's switching losses are reduced and efficiency is improved.

18 Claims, 7 Drawing Sheets

PULSE-ELIMINATION PULSE-WIDTH MODULATION

BACKGROUND

This invention relates to electronic amplifiers, and more particularly to switched-mode radio frequency (RF) power amplifiers.

Transmitters in battery-powered devices need to be efficient so that battery energy is conserved. The operating time of modern battery-powered communication devices is to a large extent limited by the power consumption, a significant part of which is attributable to the power amplifier (PA). It is therefore of interest to keep the PA efficiency as high as possible.

In conventional radio transmitters, the signal information is often represented as two channels in quadrature phase that can be mixed together to form a combined low-power signal that is amplified for transmission. A problem arises in that the amplifier types having the highest potential efficiency are also highly nonlinear, e.g., the switching types Class D, E, and F. Amplifier nonlinearity is not a problem with prior cellular telephony devices that employ constant-envelope (amplitude) modulations, but as the data rates of modern communication systems increase, more spectrally efficient types of modulation that modulate both the phase and envelope of the carrier signal are now being used.

Transmitters in many modern communication systems, such as cellular radio systems having carrier frequencies of 1-2 gigahertz (GHz) or so, need to have wide bandwidth, wide dynamic range, and high accuracy (low distortion) in phase and envelope. In addition, it is currently preferable that high-performance amplifiers be implemented in CMOS for reasons of cost and integration.

To enable a Class D amplifier, for example, to handle signals with non-constant envelopes, the amplifier can use a form of pulse width modulator (PWM) for linearization, such as described in F. Raab, "Radio Frequency Pulsewidth Modulation", *IEEE Trans. Comm.* pp. 958-966 (August 1973); M. Nielsen and T. Larsen, "An RF Pulse Width Modulator for Switch-Mode Power Amplification of Varying Envelope Signals", Silicon Monolithic Integrated Circuits in RF Systems, pp. 277-280, Aalborg University (2007); and International Publication WO 2008/002225 A1 by H. Sjöland, for example.

A radio transmitter combining two or more outputs can use PWM in several different ways, but the basic concept used to pulse-width modulate an RF signal is much the same as for a low-frequency Class D amplifier employing PWM. One difference is that instead of low-pass filtering the output signal to extract information at the same frequency as the input signal to an amplifier, a band-pass filter (BPF) is used in a transmitter to extract information around the PWM switching frequency. This is sometimes called band-pass PWM (BP-PWM) or RF PWM.

Figure 1:
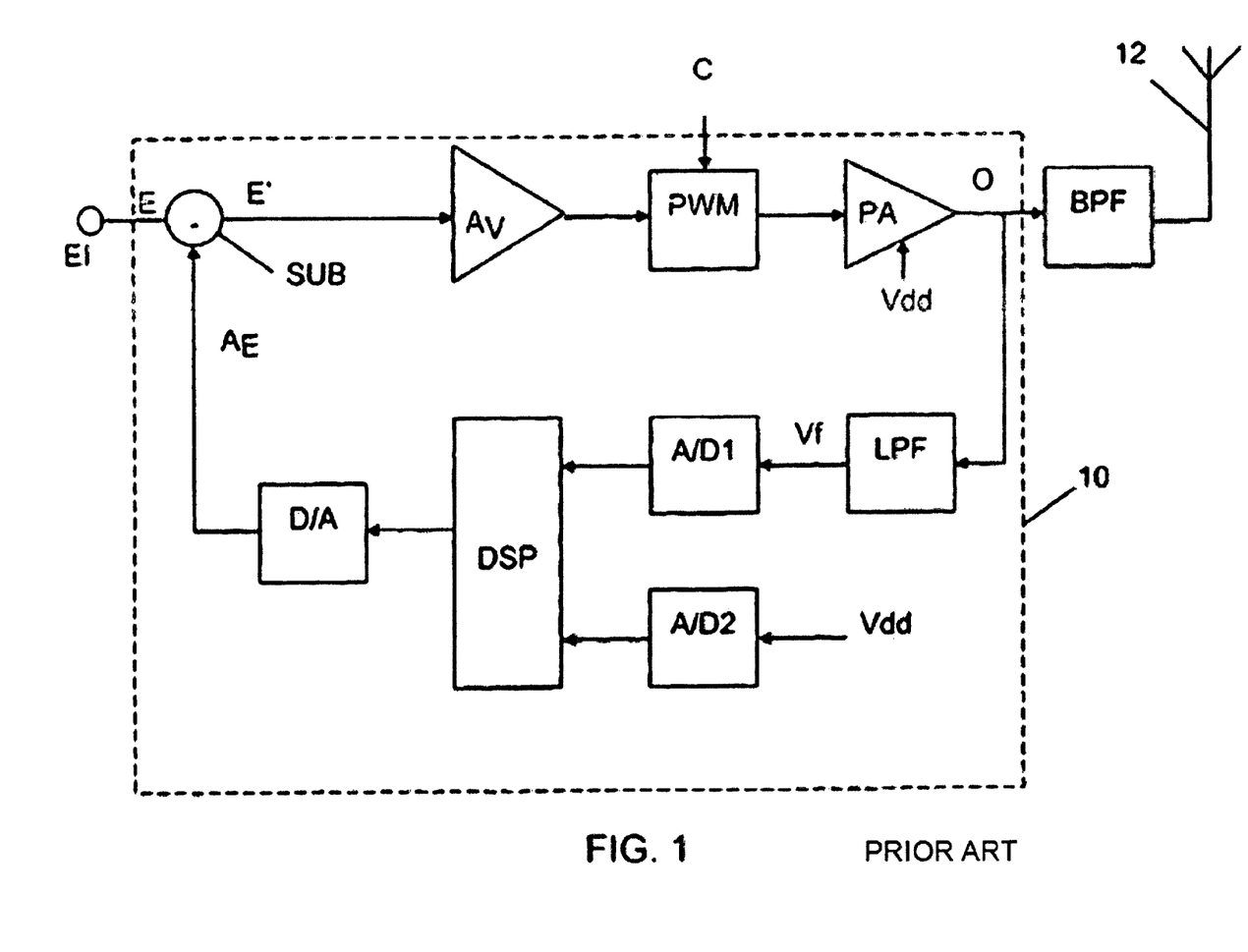
FIG. 1 is a block diagram of a portion of a radio-frequency transmitter.

As described in WO 2008/002225, FIG. 1 is a block diagram of a portion of an RF transmitter that includes a switched-mode power amplifier 10, an output band-pass filter BPF, and an antenna 12. The amplifier 10 receives an input envelope signal input EI that is connected to a first input of an arithmetic subtractor SUB. The output of the subtracting unit SUB is provided to an amplifier Av, whose output is provided to a pulse-width modulator PWM that also receives an RF carrier signal C that is to be provided with phase-information content and transmitted. The output of the modulator PWM is provided to a power amplifier PA that receives a supply voltage Vdd and provides an amplified version of the output of the modulator PWM to the bandpass filter BPF, which is connected to the antenna 12. A second input of the subtractor SUB receives a feedback signal from the output of the power amplifier PA. The feedback signal is produced by a low-pass filter LPF that is connected to the output of the power amplifier PA. The output of the filter LPF is digitized by a first analog-to-digital (A/D) converter A/D1 and provided to a digital signal processor DSP. The supply voltage Vdd is digitized by a second A/D converter A/D2 and provided to the processor DSP, which is suitably configured to produce the feedback signal that is converted from digital form to analog form by a D/A converter D/A and provided to the subtractor SUB.

An RF switched-mode PA having an input rectangular wave produces its maximum output power when the duty cycle is 50% (after band-pass filtering to extract the fundamental frequency), which is to say that the PA's maximum output power is generated when the input signal is a square wave. To reduce the PA's power/envelope, the duty cycle is altered with BP-PWM, effectively reducing the pulse-widths. This is illustrated by FIG. 2, which shows typical input and output signals for maximum output, i.e., 50% duty cycle (FIG. 2A) and a reduced duty cycle (FIG. 2B) that results in a smaller output signal envelope.

Figure 2A:
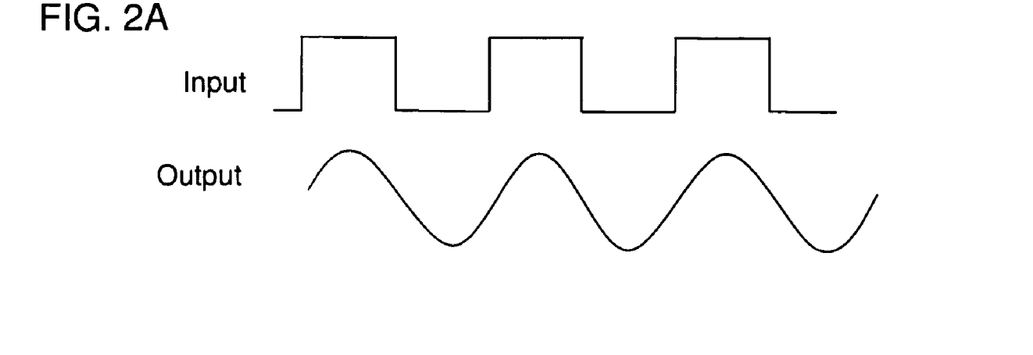
FIGS. 2A, 2B depict switched-mode amplifier input and output signals for different duty cycles.
Figure 2B:
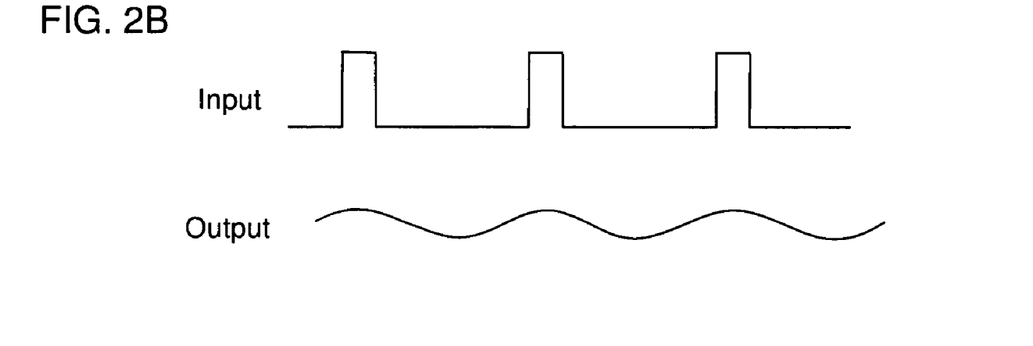
Figure 3:
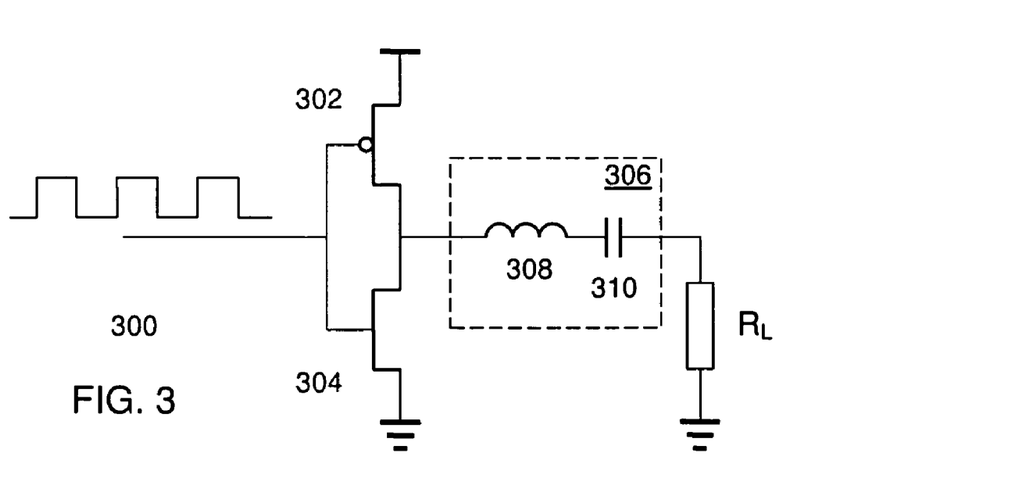
FIG. 3 is a circuit diagram of a switched-mode amplifier.

FIG. 3 depicts an example of a Class D amplifier stage 300 that can be used with BP PWM, receiving an input switched signal, such as the square wave shown in FIG. 2A. The amplifier 300 operates as an inverter stage, with high-power transistors 302, 304 and a band-pass filter 306 to extract the fundamental frequency of the amplifier output signal that is provided to a resistive load $R_L$. For a square-wave input signal, the amplifier 300 would produce an output signal similar to that shown in FIG. 2A. As depicted in FIG. 3, the filter 306 includes an inductance 308 and a capacitance 310, but of course other topologies can be used. In addition, the amplifier 300 could be configured as a Class E or Class F amplifier.

In general, a switched-mode amplifier is most efficient when it operates at or close to its peak output power. This is also true for BP-PWM described above. Losses due to parasitic capacitances occur at each edge of the input (switched) signal, and in the case of an inverter-type output stage like amplifier 300, there is also a short period for every switching transition during which a short-circuit current flows through the amplifier transistors (unless the amplifier is configured to have a dead-time period).

Figure 4A:
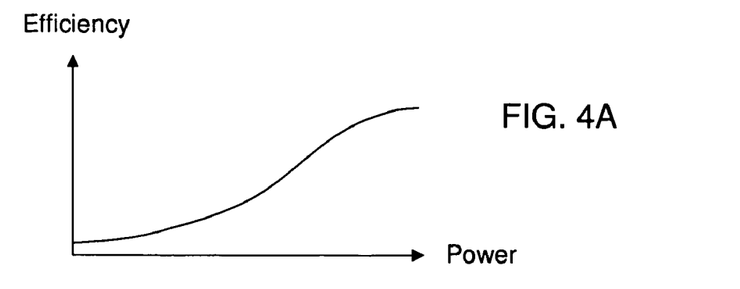
FIGS. 4A, 4B depict simulated switched-mode amplifier efficiency and output signal power under various conditions.
Figure 4B:
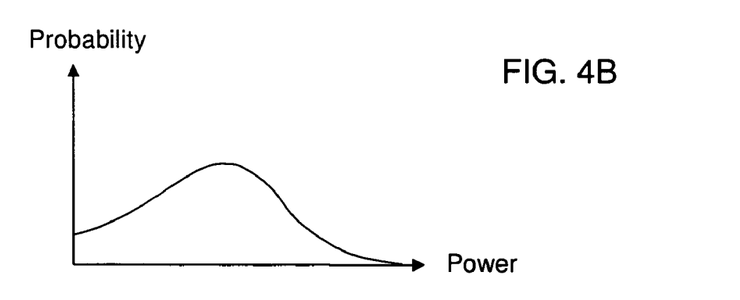
Figure 5A:
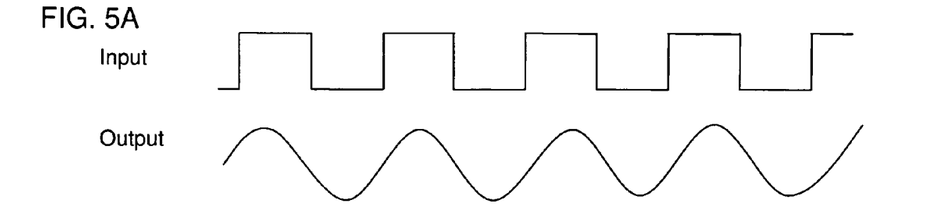
FIGS. 5A, 5B, 5C, and 5D depict input and output signals of a switched-mode amplifier having improved efficiencies at four different output power levels.
Figure 5B:
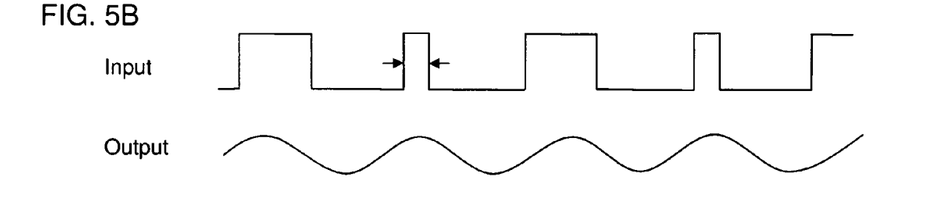
Figure 5C:
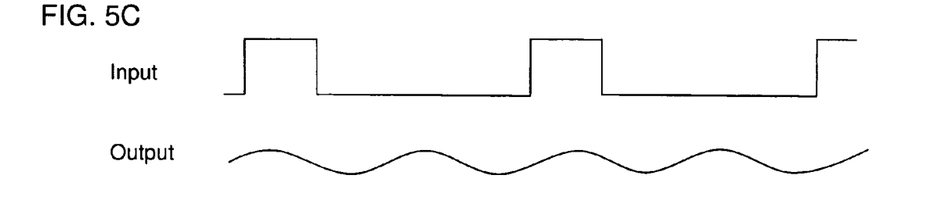
Figure 5D:
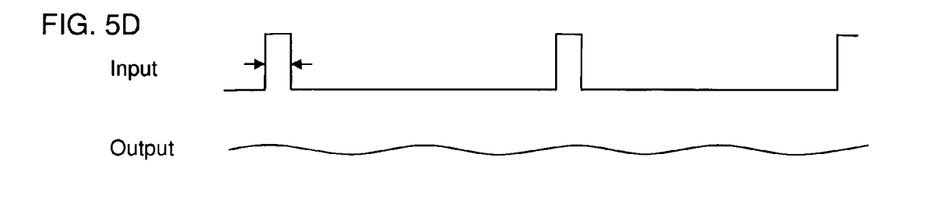

For a constant number of input pulses per unit time, the switching losses are (approximately) constant for all amplifier output power levels, and so efficiency can decrease quickly as the input signal decreases. FIG. 4 illustrates the efficiency problem. FIG. 4A is a plot of simulated amplifier efficiency against output power, roughly illustrating how the efficiency usually behaves. FIG. 4B is a plot of the probability density of output power against output power for an illustrative amplitude-modulated (AM) signal.

With modern spectrally efficient modulations, the average signal power is in many cases significantly less than the maximum instantaneous output power. In other words, the power amplifier operates most of the time at fairly low power levels and not close to its maximum where it is most efficient. Overcoming such behavior and other aspects of switched-mode amplifiers with PWM are thus highly desirable.

One known approach to improving the efficiency of amplifiers with PWM at less than maximum output power is a Doherty amplifier, which is described in the literature, e.g., V. Viswanathan, "Efficiency Enhancement of Base Station Power Amplifiers Using Doherty Technique", M. Sc. Thesis, Virginia Polytechnic Institute and State University, 2004.

Nevertheless, the gain and delay of the component amplifiers of a Doherty amplifier can be hard to match, and combining the powers of the component amplifiers and matching to a load can be hard to do accurately.

SUMMARY

In accordance with aspects of this invention, there is provided a pulse modulator for generating selected pulses of controllable widths. The pulse modulator includes a circuit arrangement configured to generate at least two pulse signals based on a reference pulse signal; at least one delay device configured to temporally displace the at least two pulse signals with respect to each other by a portion of a period of a pulse signal; a combiner configured to combine the at least two pulse signals and generate an output pulse signal of the pulse modulator; and a pulse selection network configured to select a set of pulses in the output pulse signal, the pulse selection network being configured to receive a pulse modulator input signal and the set of pulses being selected by selectively communicating the pulse modulator input signal to the circuit arrangement. The circuit arrangement includes at least one pulse-width modulator (PWM), and the widths of the pulses in the selected set are varied in accordance with the pulse modulator input signal.

In accordance with aspects of this invention, there is provided a method of generating selected pulses of controllable widths based on an input signal. The method includes generating a pulse signal based on a reference pulse signal; selecting a set of pulses in the generated pulse signal based on the input signal, wherein the selected set includes less than all pulses in the generated pulse signal; and controlling widths of the pulses in the selected set in accordance with the input signal.

In accordance with aspects of this invention, there is provided a computer-readable medium having stored instructions which, when executed by the computer, cause the computer to perform a method of generating selected pulses of controllable widths based on an input signal. The method includes generating a pulse signal based on a reference pulse signal; selecting a set of pulses in the generated pulse signal based on the input signal, wherein the selected set includes less than all pulses in the generated pulse signal; and controlling widths of the pulses in the selected set in accordance with the input signal.

BRIEF DESCRIPTION OF THE DRAWINGS

The several features, objects, and advantages of this invention will be understood by reading this description in conjunction with the drawings, in which.

DETAILED DESCRIPTION

As described in more detail below, the inventor has recognized that it is possible to operate a switched-mode amplifier more efficiently. When maximum output power is desired, the amplifier is operated in the conventional way, with an input signal that is a square wave, i.e., a rectangular signal having a 50% duty cycle. When less than maximum output power is desired, the amplifier is provided with an input rectangular signal that includes at least two different pulse widths, rather than the conventional input signal that has only one pulse width, i.e., a duty cycle that is less than 50%. For example, instead of reducing the pulse widths of all pulses simultaneously in order to reduce the amplifier's output power, the width of every other (or every n-th) pulse is reduced. When the widths of the selected pulses have been reduced to zero, the amplifier's output power can be further reduced by selecting further pulses from the remaining non-zero-width pulses, and reducing the widths of those pulses. For example, after every other pulse of the original pulsed signal has been removed, the widths of every other pulse of the remaining pulses can be reduced to obtain still lower amplifier output power. In this way, the number of pulses (and thus the number of switching transitions) is reduced for small signals, and therefore the amplifier's switching losses are reduced and efficiency is improved.

FIG. 5 shows input and output signals of a switched-mode RF amplifier (e.g., Classes D, E, and F) having improved efficiencies at four different output power levels. Time is shown in the horizontal direction in FIG. 5. FIG. 5A shows an input rectangular signal that has a 50% duty cycle, which is to say that the input signal is a square wave, and the corresponding output signal. As explained above, a square-wave input results in maximum power out of the amplifier. In FIG. 5B, the amplifier's output power is lowered by reducing the widths of a first set of pulses, instead of the conventional technique of reducing the widths of all pulses simultaneously. In FIG. 5B, the first set of pulses is every other pulse of the original input signal (shown in FIG. 5A), and two such reduced-width pulses are shown in FIG. 5B. In FIG. 5C, the widths of the pulses of the first set have been reduced to the point that the first set of pulses has completely disappeared. Thus, the amplifier is switching at half of the previous rate, effectively halving switch losses and boosting efficiency. It will be noted that the output signal depicted in FIG. 5 is that after filtering, and so the output shown in FIG. 5C (and FIG. 5D) is a harmonic rather than the fundamental of the input signal frequency. In FIG. 5D, output power is further reduced by reducing the widths of the remaining pulses.

The artisan will note the contrast with techniques like the Doherty amplifier. The inventor's technique improves amplifier efficiency locally around a point at less than maximum output by changing the signal itself, avoiding a need for multiple component amplifiers and all of the design issues (e.g., matching gains, delays, etc.) inherent in multi-amplifier configurations.

Figure 6:
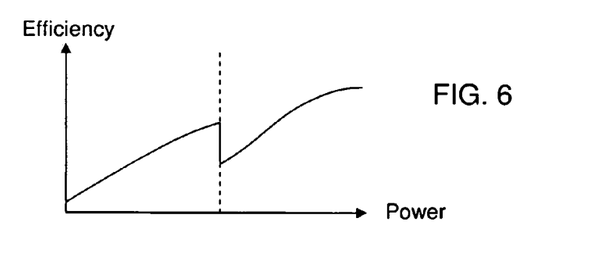
FIG. 6 depicts improved simulated switched-mode amplifier efficiency under various conditions.

FIG. 6 illustrates the effect on amplifier efficiency of reducing the widths of selected sets of pulses, such as those depicted in FIG. 5. FIG. 6 is a plot of amplifier efficiency against output power, roughly illustrating how the efficiency behaves for the case when the width of every other input signal pulse is reduced to zero (indicated by the vertical dashed line). The probability density of output power for an illustrative input AM signal can be the same as that depicted in FIG. 4B. Comparison of FIG. 6 with FIG. 4A reveals that at high power, the efficiency behaves in a similar manner as before, but at lower powers (i.e., to the left-hand side of the vertical dashed line in FIG. 6), reducing the widths of a selected set of pulses improves the efficiency. Because the input signal amplitude spends most of its time at relatively low power in many important systems, including telecommunication systems, the local improvement in efficiency can improve overall efficiency significantly.

It will be understood that this invention is not limited to removing every other pulse, which is to say in this example, every n-th pulse, where n=2. For example, it is possible to reduce or remove every third pulse (n=3) or any other set of pulses deemed suitable. It is even possible to reduce or remove more than one consecutive input pulse at once (e.g., two out of three consecutive pulses). Moreover, more than one set of pulses can be selected. For example, output power can start to be reduced by reducing the widths of a first set of pulses that includes every fourth pulse (n=4), and then the output power can be reduced further by reducing the widths of a second set of pulses that includes every other pulse (based on the original input signal or not), and then the output power can be reduced even further by reducing the widths of a third set of pulses that includes three out of four consecutive pulses. The pulse rate can be minimized even further in a similar way. For the third set in this example, the amplifier's switching losses should be reduced to a quarter of their maximum. It will be understood that other sets of pulses can be chosen.

Figure 7A:
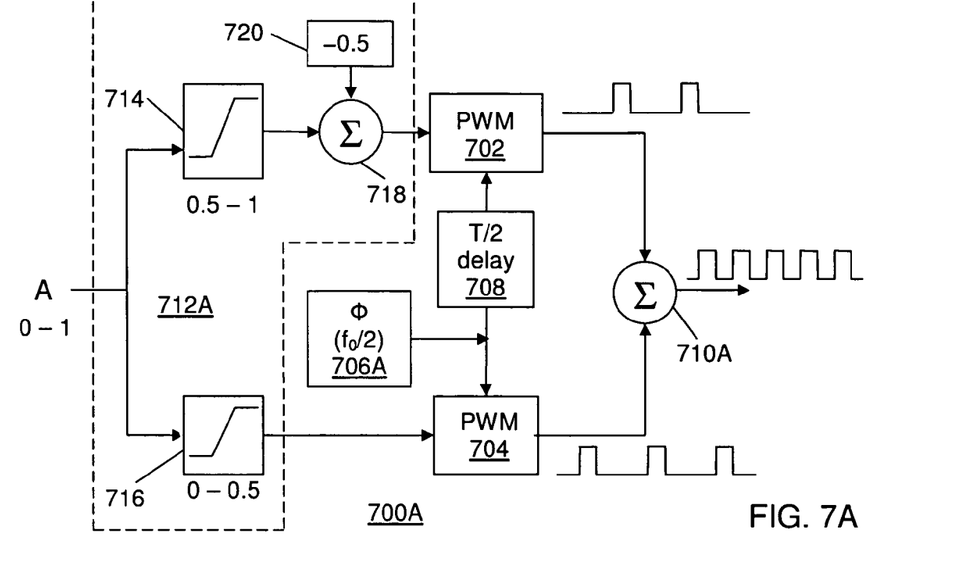
FIGS. 7A, 7B, 7C are block diagrams of portions of pulse modulators for an improved switched-mode amplifier and radio-frequency transmitter.

FIG. 7A is a block diagram of a pulse modulator 700A that can generate an input signal, such as those depicted in FIG. 5, for a switched-mode amplifier, such as that depicted in FIG. 3, or that can be used as a PWM in a radio transmitter, such as that depicted in FIG. 1. The modulator 700A includes two conventional PWMs 702, 704, a reference pulse generator 706A, a half-period delay device 708, and a combiner (summer) 710A. The PWMs 702, 704 can be implemented by conventional comparator integrated circuits as explained in U.S. patent application Ser. No. 12/127,126 filed on May 27, 2008, by C. Bryant for "Pulse-Width Modulator Methods and Apparatus" and the other documents cited above. The generator 706A produces a rectangular-pulse signal such that the repetition frequency of the pulses is one half of the frequency $f_0$ desired in the output signal of the modulator 700A. In a telecommunication system, the frequency $f_0$ would typically be the frequency of the carrier signal. The delay device 708 adjusts the two PWMs 702, 704 such that they are substantially 180-degrees apart by adjusting the relative phase of the reference pulses input to the PWMs 702, 704 from the generator 706A.

An input signal is provided to the modulator 700A at point A in FIG. 7A, which is an input to a pulse selection network 712A that selects a set of pulses whose widths are varied in accordance with the input signal. For convenience of explanation in this example, the amplitude of the input signal can be considered as having a normalized range of zero to unity. An input signal amplitude of zero to either of the PWMs 702, 704 means that the respective PWM is off, generating no output pulses provided to the combiner 710A. An input amplitude of 0.5 to either of the PWMs 702, 704, which together comprise a circuit arrangement configured to generate at least two pulse signals based on a reference pulse signal, results in an output pulse train having a 25% duty cycle provided to the combiner 710A. It will therefore be understood that the output signal of the modulator 700A produced by the combiner 710A is a square wave when the input signals to the PWMs 702, 704 have amplitudes of 0.5.

Accordingly, the pulse selection network 712A selects every other pulse in the modulator output signal for an input signal in the upper half of its range, with the result that the widths of the selected pulses are varied based on the amplitude of the input signal. As depicted in FIG. 7A, the selection network 712A includes amplitude limiters 714, 716 and a summer 718 and scale constant 720 that operate to limit the ranges of the PWMs 702, 704 to one-half to unity and zero to one-half, respectively, of the input signal range. It will be understood that the selection network 712A can be implemented in many ways, for example, as a suitably programmed device, such as a DSP or a gate array, and that the arrangement depicted in FIG. 7A is just one example.

The operation of the modulator 700A can be understood by considering the modulator output signal produced by the combiner 710A for some different modulator input signals. For an input signal amplitude of zero, both PWMs 702, 704 are off. For input signal amplitudes between zero and one-half, only PWM 704 is on, which is to say that PWM 704 generates a train of pulses having widths that correspond to the input signal amplitude with a duty cycle less than 25%. For input signal amplitudes between one-half and unity, PWM 704 is fully on (i.e., it generates a pulse train having a duty cycle of 25%), and PWM 702 is on. For an input signal amplitude of unity, both PWMs 702, 704 are fully on and the combiner 710A generates a square wave output signal. This condition is depicted by the pulsed signals shown in FIG. 7A.

Figure 7B:
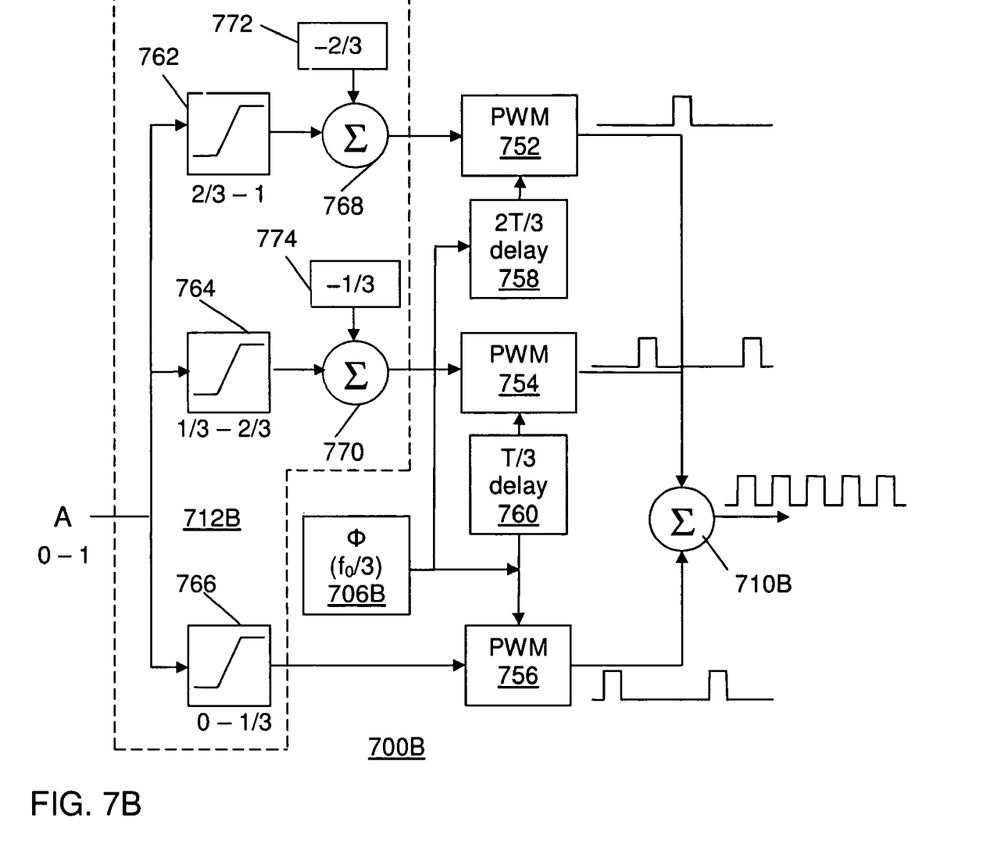

FIG. 7B is a block diagram of a pulse modulator 700B that, like the modulator 700A, can generate an input signal for a switched-mode amplifier or a radio transmitter. The modulator 700B includes three conventional PWMs 752, 754, 756, a reference pulse generator 706B, a two-thirds-period delay device 758, a one-third-period delay device 760, and a combiner (summer) 710B. The PWMs 752, 754, 756 can be implemented by conventional comparator integrated circuits like the PWMs 702, 704, and like the PWMs 702, 704, together comprise a circuit arrangement configured to generate at least two pulse signals based on a reference pulse signal. The generator 706B produces a rectangular-pulse signal such that the repetition frequency of the pulses is one third of the frequency $f_0$ desired in the output signal of the modulator 700B. The delay devices 758, 760 adjust the three PWMs 752, 754, 756 such that they are substantially 120-degrees apart by adjusting the relative phases of the reference pulses input to the PWMs 752, 754, 756 from the generator 706B.

An input signal is provided to the modulator 700B at point A in FIG. 7B, which is an input to a pulse selection network 712B that selects a set of pulses whose widths are varied in accordance with the input signal. As in FIG. 7A, the amplitude of the input signal can be considered as having a normalized range of zero to unity, and an input signal amplitude of zero to any of the PWMs 752, 754, 756 means that the respective PWM is off. An input amplitude of one third to any of the PWMs 752, 754, 756 results in an output pulse train having a 16.7% duty cycle provided to the combiner 710B.

Accordingly, the pulse selection network 712B selects every third pulse (n=3) in the modulator output signal for an input signal in the upper third of its range, with the result that the widths of the selected pulses are varied based on the amplitude of the input signal. As depicted in FIG. 7B, the selection network 712B includes amplitude limiters 762, 764, 766, summers 768, 770, and scale constants 772, 774 that operate to limit the ranges of the PWMs 752, 754, 756 to two-thirds to unity, one-third to two-thirds, and zero to one-third, respectively, of the input signal range. It will be understood that the selection network 712B can be implemented in many ways, for example, as a suitably programmed device, such as a DSP or a gate array.

The arrangements depicted in FIGS. 7A, 7B are just two examples of a modulator in which m out of n pulses are selected. For example, the modulators 700A, 700B can be divided into more branches, with the limiters operating in smaller intervals. Moreover, it is possible for more than one set of pulses to be controlled simultaneously, e.g., by overlapping selection intervals, and two sets of pulses can even share the same duty cycle. In other embodiments, the number of PWMs can be reduced to one, although other portions of the modulator get more complicated.

Figure 7C:
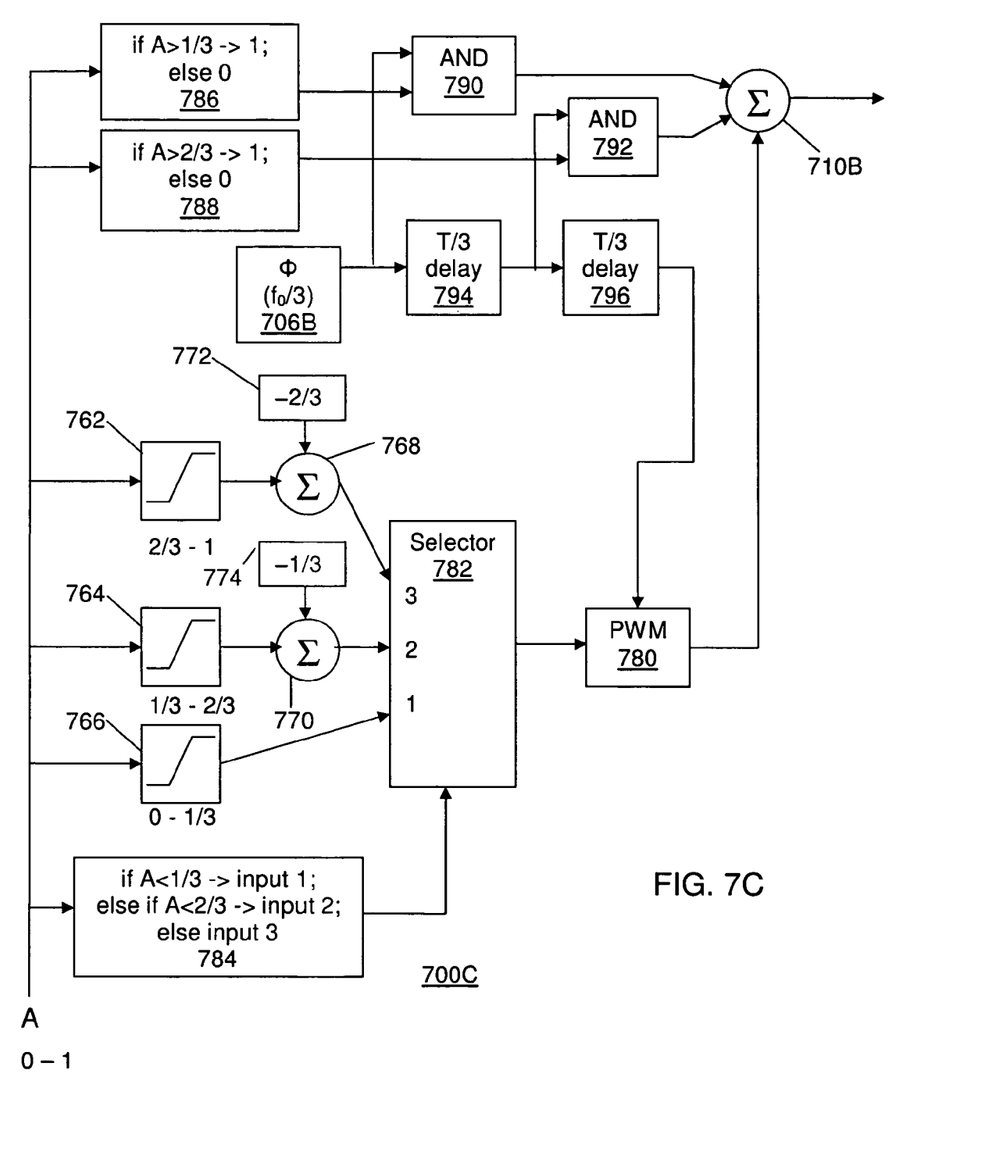

For example, FIG. 7C is a block diagram of a pulse modulator 700C that is a variation of the modulator 700B having a single PWM 780. Components or functional blocks in FIG. 7C that have the same functionality as components or functional blocks in FIG. 7B have the same reference numerals. The arrangement depicted in FIG. 7C includes the system of FIG. 7B for selecting among amplitude ranges of the input signal at point A, but that system is supplemented by a selector 782, which responds to a control signal generated by a range selector 784 such that it passes one of the three amplitude ranges to the PWM 780. For the example depicted in FIG. 7C, a suitable selector 784 can include two comparators and two voltage references. A more complicated selector 784 can include an A/D converter and a logic network, such as a DSP.

The PWM 780 starts at zero for an input of 0, and reaches its maximum (i.e., 16.7% duty cycle) for an input signal amplitude of $1/3$. As the input amplitude becomes greater than $1/3$, the PWM 780 begins at zero again, while one of the additional sets of reference pulses is added to the output produced by the combiner 710B by the pulse generator 706B and a network comprising selectable generators 786, 788, logical AND gates 790, 792, and one-third-period delay devices 794, 796. As the input signal amplitude becomes greater than $2/3$, the PWM 780 begins at zero once again, while another of the additional sets of reference pulses is added to the output. Each generator 786, 788 provides either a logical zero or a logical one signal to the AND gates 790, 792, respectively, depending on the amplitude of the input signal at point A. The AND gates 790, 792 pass or block pulses from the generator 706B. In effect, the fully on or fully off PWMs in the arrangements shown in FIGS. 7A, 7B have been replaced by passing or blocking a set of reference pulses. Thus, the PWM 780 and the AND gates 790, 792 together comprise a circuit arrangement configured to generate at least two pulse signals based on a reference pulse signal. It will be noted that in the arrangement of FIG. 7C, only one set of reference pulses is width-modulated.

Each pulse edge introduces some nonlinearity into the combined signal produced by the combiner 710A, 710B. Such nonlinearity results in part from the practical inability of the PWMs to produce vertical pulse edges. This may be compensated by suitably predistorting the input signal, which can be carried out in many well known ways. It may also be possible to even out the transitions by introducing some overlap where both PWMs 702, 704 or PWM pairs 752, 754, and 754, 756 are modulated. In the arrangement of FIG. 7A, transitions occur at input signal amplitudes around 0.5, and in the arrangement of FIG. 7B, transitions occur at input signal amplitudes around $1/3$ and $2/3$. In FIG. 7A for example, one pulse width modulator is trying to produce very thin pulses when the input signal amplitude is just above 0.5. Because it is impossible to produce infinitely narrow pulses, there is likely to be some distortion at this point. Of course, overlap is not possible with the arrangement depicted in FIG. 7C that uses only one PWM.

Nonlinearities can also be compensated by providing low-pass-filtered feedback. With BP-PWM, the envelope of the input signal has a sinusoidal, and thus non-linear, relationship to the duty cycle of the output. Modulators of this type can be linearized using low-pass feedback, as described in the document by M. Nielsen et al. and WO 2008/002225 cited above and in U.S. patent application Ser. No. 12/135,326 filed on Jun. 9, 2008, by Carl Bryant for "Quadrature Pulse-Width Modulation Methods and Apparatus". With respect to application Ser. No. 12/135,326, which is incorporated here by reference, a suitable arrangement look like its FIG. 6, with the PWM 602 representing the modulator 700A, 700B.

An RF PWM signal that is single-ended, i.e., a signal that has one output and is not differential, contains low-frequency information (before band-pass filtering the output signal) that is related to the envelope, and thus this information can be extracted for use in an envelope feedback loop. It is currently believed that extracting the low-frequency information should be insensitive to delay because extracted information is at baseband. Although the modulator 700A, 700B includes two (or more) component PWMs, low-pass-filtered feedback can be used globally to cancel amplitude distortion.

Although selecting every m out of n pulses as in the modulators 700A, 700B, 700C can advantageously increase amplifier efficiency, it can be expected that switch noise may be introduced into the amplifier output signal at frequencies that are m/n and (n-m)/n of the carrier frequency away from the carrier frequency. A suitable filter may be needed to eliminate or reduce such switch noise sufficiently. As the number of pulses is reduced, the filter requirements become more stringent.

Effects of switch noise can be reduced by randomly or pseudorandomly selecting sets of pulses. For example, whether a pulse is to be pulse-width modulated can be randomly or pseudorandomly determined at the time of the pulse, with a time-average of the number of pulse-width modulated pulses being such that the desired amplifier performance is obtained. Randomizing the pulse selection in this way should spread out the switch noise, although the signal to the PWMs would vary with time.

Figure 8:
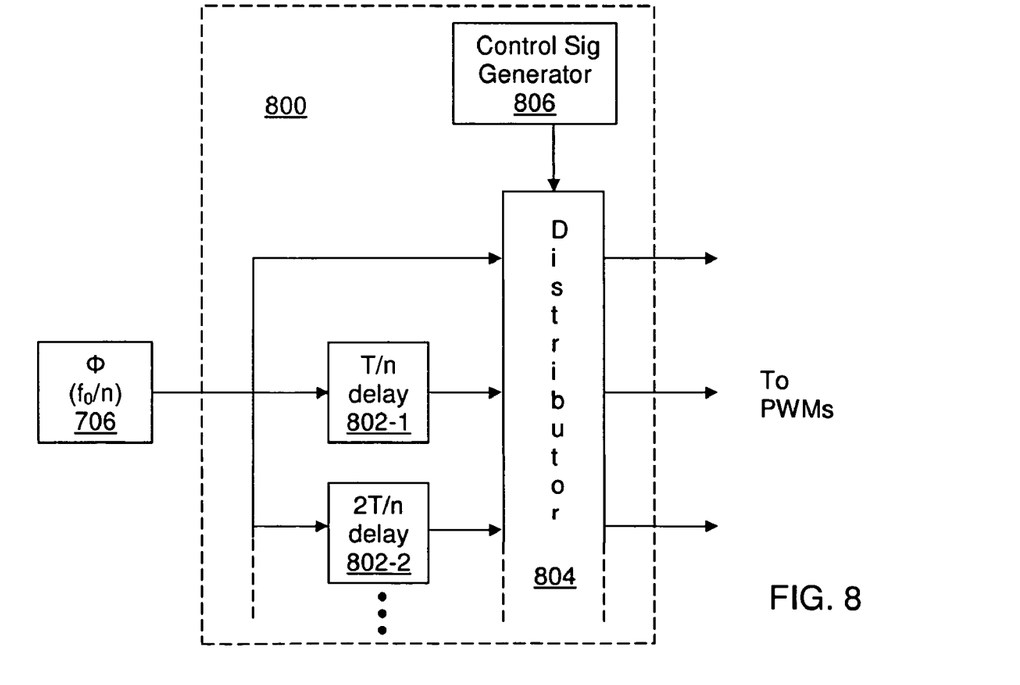
FIG. 8 depicts an arrangement for randomly or pseudorandomly distributing reference pulses.

In order to randomly or pseudorandomly select a set of pulses, one can suitably distribute the pulses from the reference pulse generator 706A, 706B with a pulse selector 800 such as that depicted in FIG. 8. The selector 800 comprises delay devices 802-1, 802-2, . . . , which time delay reference pulses produced by a generator 706 by respective fractions m/n of a period T, where m and n are positive integers and m<n as described above. The period T may be the inverse of the frequency $f_0$ desired in the output signal of the modulator 700A, 700B, 700C, and the generator 706 is comparable to the generators 706A, 706B, producing pulses at repetition frequency that is a fraction (1/n) of the frequency $f_0$. The selector also comprises a pulse distributor 804 that is responsive to a control signal produced by a generator 806 and that can be considered a controllable switch. The control signal is such that delayed pulses appear at respective outputs of the distributor 804 in a desired random or pseudorandom fashion.

It will be understood that the pulse selector 800 does not, strictly speaking, randomize the number of reference pulses in a given time period produced by the pulse generators 706A, 706B, but instead the selector 800 randomizes the phases of the selected pulses. In the modulators 700A, 700B, 700C, all reference pulse inputs would be connected to a randomly selected output in the selector 800, and the number of delay devices 802 would typically be N−1.

As explained above, FIG. 8 depicts an extended generalization of a pulse selector for generating N pulse sets, and so to make a complete modulator, the selector 800 of FIG. 8 is combined with PWMs and a suitable pulse selection network 712A, 712B, extended if needed for N>3 different control intervals. Network 712A is useful for N=2, and network 712B is useful for N=3. Although the reference phases are different (i.e., 0 T, 1 T, 2 T, ..., (N−1)T), the n-th overtones of all pulse sets have substantially the same phase, and so the sets can be randomly interleaved without substantially affecting the desired signal. It should be noted that all outputs from the distributor 804 are connected to an input and all inputs are connected to an output, although the input-output pairings are randomized based on the control signal from the generator 806. Because the switching noise is randomly distributed, a larger N can be chosen, improving efficiency for small signals without requiring a narrower output filter.

Figure 9:
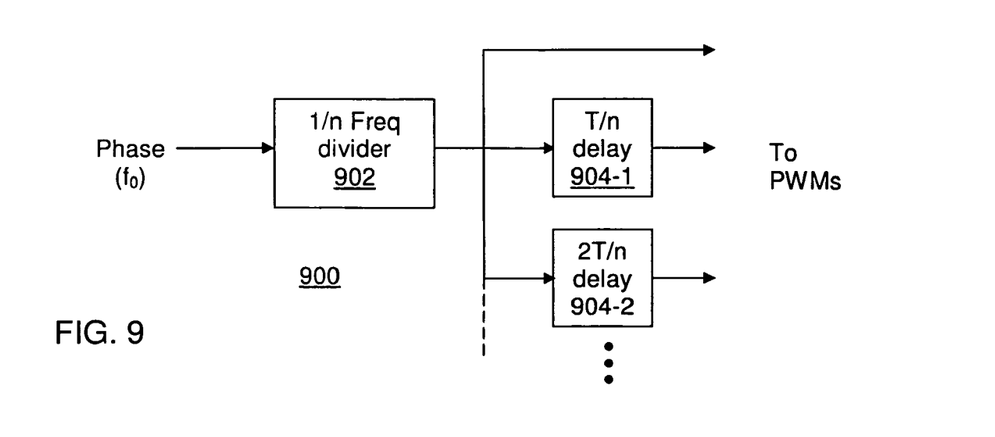
FIG. 9 depicts an arrangement for adjusting the phases of reference pulses.

It should be understood that the input signal presented to point A in the pulse modulators 700A, 700B, 700C described above need not be limited to an envelope signal. Phase information in the input signal can be introduced by correspondingly varying the temporal positions of the reference pulses provided to the PWMs. FIG. 9 is a block diagram of one example of a suitable arrangement 900 for adjusting the phases of reference pulses (i.e., the pulses' positions in time). A pulsed phase information signal, which is often a signal at the frequency $f_0$ desired in the output signal of the pulse modulator, switched-mode amplifier, or transmitter, is provided to a frequency divider 902, which produces a phase signal having pulses at a frequency that is a fraction (1/n) of the frequency $f_0$. Delay devices 904-1, 904-2, ... time-delay the pulses produced by the divider 902 by respective fractions m/n of a period T, where m, n, and T are as described above. It will be observed that the difference between the networks 900 and 800 is the distributor 804 and generator 806.

Figure 10:
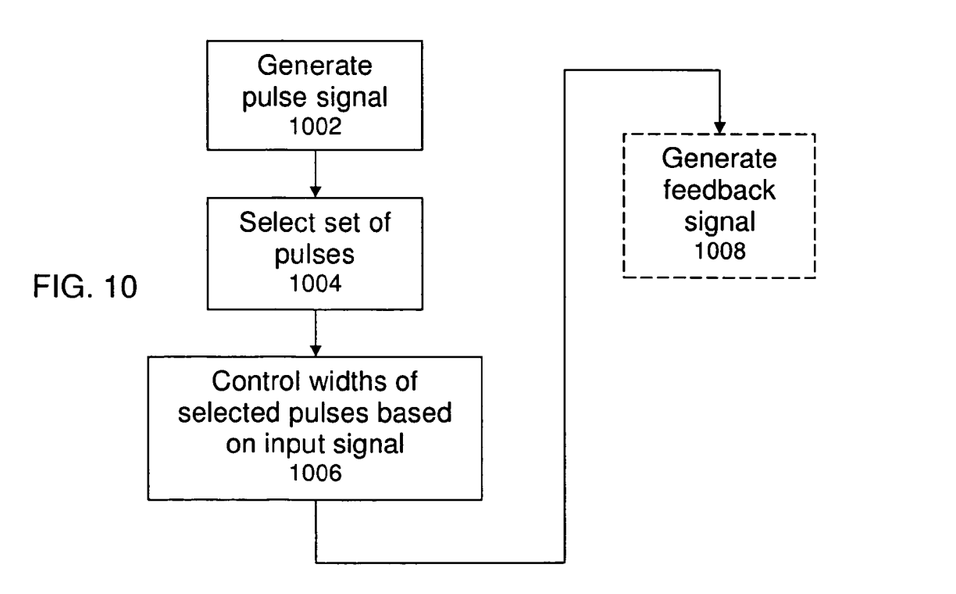
FIG. 10 is a flow chart of a method of generating selected pulses of controllable widths based on an input signal.

FIG. 10 is a flowchart of a method of generating selected pulses of controllable widths based on an input signal, such as the method implemented by the modulators 700A, 700B, 700C. In step 1002, a pulse signal based on a reference pulse signal is generated, and in step 1004, a set of pulses in the generated pulse signal is selected based on the input signal. In step 1006, the widths of the pulses in the selected set are controlled in accordance with the input signal. An example of selection of every other pulse is performed by the network 712A described above, and controlling widths can include generating at least two signals that each have an amplitude range that is substantially one-half of an amplitude range of the input signal. As an optional additional step 1008, at least one low-pass-filtered feed-back signal based on the pulse signal can be generated and added to the input signal.

With the methods and arrangements described in this application, switched-mode amplifier efficiency should increase for smaller input signals due to lower switching losses. High small-signal efficiency is important for maximizing overall efficiency with modern modulations that demand close to maximum output power only a fraction of the time. Unlike a Doherty amplifier, the advantages of the methods and apparatus described in this application can be enjoyed with no need for multiple amplifiers, reducing the cost and complexity of a switched-mode amplifier. With RF PWM, a modulator needs to handle minute changes in time accurately while modulating the envelope, and so it can be expected that the above-described methods and apparatus can improve the modulation accuracy because relative changes in pulse width are increased when only a subset of pulses, such as every other pulse, is modulated.

It will be appreciated that procedures described above are carried out repetitively as necessary, for example, to respond to the time-varying nature of communication signals exchanged by transmitters and receivers.

To facilitate understanding, many aspects of this invention are described in terms of sequences of actions that can be performed by, for example, elements of a programmable computer system. It will be recognized that various actions could be performed by specialized circuits (e.g., discrete logic gates interconnected to perform a specialized function or application-specific integrated circuits), by program instructions executed by one or more processors, or by a combination of both. Wireless transceivers implementing embodiments of this invention can be included in, for example, mobile telephones, pagers, headsets, laptop computers and other mobile terminals, base stations, and the like.

Moreover, this invention can additionally be considered to be embodied entirely within any form of computer-readable storage medium having stored therein an appropriate set of instructions for use by or in connection with an instruction-execution system, apparatus, or device, such as a computer-based system, processor-containing system, or other system that can fetch instructions from a medium and execute the instructions. As used here, a "computer-readable medium" can be any means that can contain, store, communicate, or transport the program for use by or in connection with the instruction-execution system, apparatus, or device. The computer-readable medium can be, for example but not limited to, an electronic, magnetic, optical, electromagnetic, infrared, or semiconductor system, apparatus, device, or medium. More specific examples (a non-exhaustive list) of the computer-readable medium include an electrical connection having one or more wires, a portable computer diskette, a random-access memory (RAM), a read-only memory (ROM), an erasable programmable read-only memory (EPROM or Flash memory), and an optical fiber.

Thus, the invention may be embodied in many different forms, not all of which are described above, and all such forms are contemplated to be within the scope of the invention. For each of the various aspects of the invention, any such form may be referred to as "logic configured to" perform a described action, or alternatively as "logic that" performs a described action.

It is emphasized that the terms "comprises" and "comprising", when used in this application, specify the presence of stated features, integers, steps, or components and do not preclude the presence or addition of one or more other features, integers, steps, components, or groups thereof.

The particular embodiments described above are merely illustrative and should not be considered restrictive in any way. The scope of the invention is determined by the following claims, and all variations and equivalents that fall within the range of the claims are intended to be embraced therein.

What is claimed is:

1. A pulse modulator for generating selected pulses of controllable widths, comprising:
   a circuit arrangement configured to generate at least two pulse signals based on a reference pulse signal, wherein the circuit arrangement includes at least one pulse-width modulator (PWM);
   at least one delay device configured to temporally displace the at least two pulse signals with respect to each other by a portion of a period of a pulse signal;

a combiner configured to combine the at least two pulse signals and generate an output pulse signal of the pulse modulator; and a pulse selection network configured to select a set of pulses in the output pulse signal, the pulse selection network being configured to receive a pulse modulator input signal and the set of pulses being selected by selectively communicating the pulse modulator input signal to the circuit arrangement;

wherein the widths of the pulses in the selected set are varied in accordance with the pulse modulator input signal.

2. The pulse modulator of claim 1, wherein the circuit arrangement includes at least two PWMs; the pulse selection network is configured to generate from the pulse modulator input signal at least two input signals for respective ones of the at least two PWMs; each of the at least two input signals has an amplitude range that is substantially one-half of an amplitude range of the pulse modulator input signal; and the amplitude ranges of the at least two input signals are substantially non-overlapped.

3. The pulse modulator of claim 1, wherein the circuit arrangement comprises a PWM and at least one logical AND gate, and the pulse modulator further comprises a device for selecting an amplitude range and providing the pulse modulator input signal in the selected amplitude range to the PWM.

4. The pulse modulator of claim 1, wherein the pulse selection network is configured to selects m out of n pulses in the output pulse signal, m and n are integers, and m<n.

5. The pulse modulator of claim 1, wherein the pulse selection network is configured to randomly or pseudorandomly select pulses in the output pulse signal.

6. The pulse modulator of claim 1, further comprising a phase network configured to adjust phases of reference pulses based on phase information in the pulse modulator input signal.

7. The pulse modulator of claim 1, wherein the modulator is included in a switched-mode amplifier.

8. The pulse modulator of claim 1, wherein the modulator is included in a radio-frequency transmitter.

9. A method of generating selected pulses of controllable widths based on an input signal, comprising:

generating a pulse signal based on a reference pulse signal;

selecting a set of pulses in the generated pulse signal based on the input signal, wherein the selected set includes less than all pulses in the generated pulse signal;

controlling widths of the pulses in the selected set in accordance with the input signal; and selecting an amplitude range, wherein widths of pulses in the selected set are controlled in accordance with the input signal in the selected amplitude range.

10. The method of claim 9, wherein controlling widths comprises generating from the input signal at least two signals that each have an amplitude range that is substantially one-half of an amplitude range of the input signal; and the amplitude ranges of the at least two signals are substantially non-overlapped.

11. The method of claim 9, wherein selecting a set of pulses comprises selecting m out of n pulses in the generated pulse signal, m and n are integers, and m<n.

12. The method of claim 9, wherein selecting a set of pulses comprises randomly or pseudorandomly selecting pulses in the generated pulse signal.

13. The method of claim 9, further comprising adjusting phases of pulses in the reference pulse signal based on phase information in the input signal.

14. A computer-readable medium having stored instructions which, when executed by the computer, cause the computer to perform a method of generating selected pulses of controllable widths based on an input signal, wherein the method comprises:

generating a pulse signal based on a reference pulse signal;

selecting a set of pulses in the generated pulse signal based on the input signal, wherein the selected set includes less than all pulses in the generated pulse signal;

controlling widths of the pulses in the selected set in accordance with the input signal; and selecting an amplitude range, wherein widths of pulses in the selected set are controlled in accordance with the input signal in the selected amplitude range.

15. The medium of claim 14, wherein controlling widths comprises generating from the input signal at least two signals that each have an amplitude range that is substantially one-half of an amplitude range of the input signal; and the amplitude ranges of the at least two signals are substantially non-overlapped.

16. The medium of claim 14, wherein selecting a set of pulses comprises selecting m out of n pulses in the generated pulse signal, m and n are integers, and m<n.

17. The medium of claim 14, wherein selecting a set of pulses comprises randomly or pseudorandomly selecting pulses in the generated pulse signal.

18. The medium of claim 14, further comprising adjusting phases of pulses in the reference pulse signal based on phase information in the input signal.

* * * * *